(12) United States Patent  
Hamaguchi et al.

(10) Patent No.: US 6,459,711 B1
(45) Date of Patent: Oct. 1, 2002

(54) OPTICAL SEMICONDUCTOR DEVICE

(75) Inventors: Shin-ichi Hamaguchi, Amagasaki; Yuzo Shimizu, Mukou; Toru Tsuruta, Suita; Masanori Hirose, Nagaokakyou, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/477,426

(22) Filed: Jan. 4, 2000

(30) Foreign Application Priority Data

Jan. 13, 1999 (JP) ............................................. 11-006689

(51) Int. Cl.$^7$ ............................................. H01S 5/022
(52) U.S. Cl. ............................................. 372/36; 372/31
(58) Field of Search ...................................... 372/36, 31

(56) References Cited

U.S. PATENT DOCUMENTS 5,793,785 A * 8/1998 Nakanishi et al. ............. 372/36

FOREIGN PATENT DOCUMENTS

| JP | 6433733 | 2/1989 |
| JP | 4162783 | 6/1992 |
| JP | 773503 | 3/1995 |
| JP | 7106702 | 4/1995 |
| JP | 07211985 | 8/1995 |
| JP | 7273370 | 10/1995 |
| JP | 851254 | 2/1996 |
| JP | 955532 | 2/1997 |
| JP | 9191154 | 7/1997 |

OTHER PUBLICATIONS

Japanese Patent Office with English Translation, Jul. 6, 1999.
Japanese Patent Office Action (in Japanese) with English translation thereof, Apr. 11, 2000.

* cited by examiner

Primary Examiner—James Davie
(74) Attorney, Agent, or Firm—Stevens, Davis, Miller & Mosher, LLP

(57) ABSTRACT

To more precisely output signals of optical recording media, a semiconductor laser element is mounted in a concave portion on the surface of a semiconductor substrate so that the optical axis of signal detecting light emitted from the semiconductor laser element is substantially parallel to the surface of the semiconductor substrate, and the light emitted from the semiconductor laser element is reflected at the side surface of the concave portion that is opposed to the signal detecting light emitting side of the semiconductor laser element in a direction substantially perpendicular to the surface of the semiconductor substrate. A light receiving portion for signal detection is provided in an area outside the concave portion on the surface of the semiconductor substrate where the semiconductor laser element is mounted. When the signal detecting light emitting side of the semiconductor laser element is the front side of the semiconductor laser element, a first light intercepting region is provided in areas posterior to, obliquely posterior to and at the left and right sides of the semiconductor laser element on the bottom surface of the concave portion, and a second light intercepting region is provided on, of the side surfaces of the concave portion, at least the side surface between the semiconductor laser element and the light receiving portion.

6 Claims, 14 Drawing Sheets

OPTICAL SEMICONDUCTOR DEVICE

BACKGROUND OF THE INVENTION

1. Field of the Invention

The present invention relates to an optical semiconductor device having both light emission and light reception and being used for optical information processing, optical measurement, optical communications and the like.

2. Description of the Related Art

In recent years, as optical semiconductor devices used for optical information processing, optical measurement, optical communication and the like, ones have come to be used in which a light source and a light receiving portion (photodetector) are provided in the same package.

A conventional optical semiconductor device will be described. FIG. 19 is a plan view schematically showing a plane layout of the conventional optical semiconductor device. FIG. 20 is cross-sectional view schematically showing the cross section of FIG. 19 taken on the line 20–21. FIG. 21 is a cross section of FIG. 19 taken on the line 21—21.

In FIGS. 19, 20 and 21, a semiconductor substrate 1 is made of, for example, Si, and has a rectangular concave portion 1a on the surface thereof. A semiconductor laser element 2 is made of, for example, GaAs, and acts as a light source for emitting signal detecting light. The semiconductor laser element 2 is mounted in the concave portion 1a so that the optical axis of the signal detecting light is substantially parallel to the surface of the semiconductor substrate 1, and is integrated with the semiconductor substrate 1.

The concave portion 1a is formed so that the signal detecting light from the semiconductor laser element 2 is reflected at the inclined side surface of the concave portion 1a that is opposed to the signal detecting light emitting side of the semiconductor laser element 2 in the direction substantially perpendicular to the surface of the semiconductor substrate 1. In the part of the bottom surface of the concave portion 1a where the semiconductor laser element 2 is mounted, although not shown, one electrode for applying a voltage to the semiconductor laser element 2 is formed. The other electrode of the semiconductor laser element 2 is formed on the top surface of the semiconductor laser element 2.

Light receiving portions 3 to 8 for signal detection are, for example, impurity diffused regions, and are formed outside the concave portion 1a on the surface of the semiconductor substrate 1. For example, when the signal detecting light emitting side of the semiconductor laser element 2 on the surface of the semiconductor substrate 1 is the front side of the semiconductor laser element 2, the light receiving portions 3 to 8 are selectively formed at the left and right sides of the concave portion 1a.

The semiconductor substrate 1 and the light receiving portions 3 to 8 are opposite in conductivity type. Between the semiconductor substrate 1 and the light receiving portions 3 to 8, a voltage that causes a reverse bias is applied.

A monitor region 12 is, for example, an impurity diffused region, is disposed in the rear of the concave portion 1a on the surface of the semiconductor substrate 1, and detects the quantity of the signal detecting light from the semiconductor laser element 2. The semiconductor substrate 1 and the monitor region 12 are opposite in conductivity type. Between the semiconductor substrate 1 and the monitor region 12, a voltage that causes a reverse bias is applied. The impurity concentration of the monitor region 12 is approximately the same as that of the light receiving portions 3 to 8.

In this optical semiconductor device, as shown by the arrow 9 in FIG. 21, the signal detecting light from the semiconductor laser element 2 is emitted in a direction substantially parallel to the surface of the semiconductor substrate 1, and is reflected at the inclined side surface of the concave portion 1a situated in front to exit in a direction substantially perpendicular to the surface of the semiconductor substrate 1.

The light receiving portions 3 to 8 are formed in positions outside the emission direction of the signal detecting light from the semiconductor laser element 2 in order that the carriers generated by the incidence of the signal detecting light from the semiconductor laser element 2 on the semiconductor substrate 1 do not adversely affect the signal detection levels of the light receiving portions 3 to 8. For example, when the signal detecting light emitting side of the semiconductor laser element 2 is the front side of the semiconductor laser element 2, the light receiving portions 3 to 8 are formed at the left and right sides of the semiconductor laser element 2 and at the left and right sides of the concave portion 1a on the surface of the semiconductor substrate 1. The light receiving portions 3 to 8 may be formed in any positions that is in a periphery of the semiconductor laser element 2, particularly outside the concave portion 1a. The number of light receiving portions is at least one.

The operation of the optical semiconductor device structured as described above will be described. First, the signal detecting light emitted from the semiconductor laser element 2 passes through an objective lens (not shown) and is condensed onto an optical recording medium (not shown). Consequently, the light corresponding to the signals of the optical recording medium is reflected and condensed onto the light receiving portions 3 to 8, so that optical signals are output from the light receiving portions 3 to 8. In this case, the quantity of the signal detecting light from the semiconductor laser element 2 is monitored by the monitor region 12, and the semiconductor laser element 2 is controlled so that the quantity is constant.

In the structure of the above-described conventional example, the signal detecting light is emitted from the semiconductor laser element 2 in the direction shown by the arrow 9, and unnecessary light (hereinafter, referred to as stray light) is generated in addition to the signal detecting light.

The stray light will be concretely described. The light associated with the optical semiconductor device includes the laser light emitted from the semiconductor laser element 2 (the light emitted from the front surface and the light emitted from the rear surface) and the return light by the reflection at a medium such as an optical disk or a magneto-optic disk. The light regarded as a problem in the present invention is the stray light due to the laser light emitted from the semiconductor laser element 2.

Laser light includes light effective in signal detection and light ineffective in signal detection. Laser light is emitted so as to spread 180 degrees both in the vertical and the horizontal directions (the larger the angle is, the smaller the light quantity is). The light emitted frontward from the front surface of the semiconductor laser element 2 is the light effective in signal detection (signal detecting light). Light emitted in directions other than that (slanting directions, and directions just to the right and the left) is the light ineffective in signal detection. This ineffective light becomes stray light. When the stray light is applied to the semiconductor substrate 1 and is absorbed in the semiconductor substrate 1, stray light carriers are generated.

The light emitted from the rear surface of the semiconductor laser element 2 also spreads 180 degrees both in the vertical and the horizontal directions (the larger the angle is, the smaller the light quantity is). Particularly, the light emitted rearward, that is, the light applied to the neighborhood of the monitor region 12 is used for detecting the light quantity of the semiconductor laser element 2. Light emitted in directions other than that (slanting directions, and directions just to the right and the left) becomes stray light. Some of the carriers generated by the stray light being applied to the bottom surface or the side surfaces of the concave portion 1a of the semiconductor substrate 1 are captured by the monitor region 12. However, most of the remaining carriers are absorbed in the semiconductor substrate 1 and become stray light carriers which adversely affect the light receiving portions 3 to 8.

The semiconductor laser element 2 is disposed with its front surface being close to an inclined side surface (front side surface) of the concave portion 1a, and most of the stray light emitted from the front surface impinges on the inclined side surface of the concave portion 1a. Therefore, the influence of the stray light carriers on the light receiving portions 3 to 8 is small. However, the distance between the rear surface of the semiconductor laser element 2 and the rear side surface of the concave portion 1a is comparatively large, the stray light emitted from the rear surface of the semiconductor laser element 2 is apt to be applied to the bottom surface and the side surfaces of the concave portion 1a. Since the distances between the light receiving portions 3 to 8 and the bottom and the side surfaces of the concave portion 1a are short, the stray light carriers generated in the periphery of the bottom surface and the side surfaces are apt to adversely affect the light receiving portions 3 to 8.

That is, by the stray light emitted from the rear surface of the semiconductor laser element 2 being directly or indirectly applied to the surface of the semiconductor substrate 1, particularly to the bottom or the side surfaces of the concave portion 1a and absorbed in the semiconductor substrate 1, stray light carriers are generated in the periphery of the concave portion 1a on the surface of the semiconductor substrate 1. In particular, the stray light carriers generated by the stray light emitted from the semiconductor laser element 2 toward the light receiving portions 3 to 8 and applied to the periphery of the concave portion 1a, that is, to the side surfaces of the concave portion 1a on the surface of the semiconductor substrate 1 are situated in the periphery of the light receiving portions 3 to 8. Likewise, the stray light carriers generated by the stray light applied to the bottom surface of the concave portion 1a are situated in the periphery of the light receiving portions 3 to 8. Consequently, the stray light carriers are absorbed by the light receiving portions 3 to 8, so that optical signals of levels higher than the actual signal levels are output from the light receiving portions 3 to 8.

SUMMARY OF THE INVENTION

The present invention is intended for solving the above-described conventional problem, and an object thereof is to provide an optical semiconductor device capable of more precisely outputting signals of optical recording media.

An optical semiconductor device according to a first aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; and a light intercepting region provided at least in an area posterior to the light source on a bottom surface of the concave portion when a signal detecting light emitting side of the light source is a front side.

According to this structure, the stray light (not only direct light but also reflected light is included) emitted from the rear surface of the light source so as to spread over a wide area is prevented by the light intercepting region from intruding into the semiconductor substrate at least through the area posterior to the light source on the bottom surface of the concave portion, so that the generation of stray light carriers due to the intrusion of the stray light into the semiconductor substrate can be suppressed. Consequently, the stray light carriers can be prevented from being absorbed by the light receiving portion, so that signals of optical recording media can be more precisely output.

In the above-described structure, by forming the light intercepting region also in an area obliquely posterior to the light source on the bottom surface of the concave portion, the stray light is prevented from intruding into the semiconductor substrate through the area obliquely posterior to the light source on the bottom surface of the concave portion, so that the generation of stray light carriers due to the intrusion of the stray light into the semiconductor substrate can be further suppressed. Consequently, the stray light carriers can be further prevented from being absorbed by the light receiving portion, so that signals of optical recording media can be more precisely output.

Further, by forming the light intercepting region in an area surrounding the light source on all sides on the bottom surface of the concave portion, the stray light is prevented from intruding into the semiconductor substrate through the area surrounding the light source on all sides on the bottom surface of the concave portion, so that the generation of stray light carriers due to the intrusion of the stray light into the semiconductor substrate can be further suppressed. In this case, the stray light emitted from the front surface of the light source so as to spread over a wide area can be also prevented by the light intercepting region from intruding into the semiconductor substrate through an area in front of the concave portion on the bottom surface of the concave portion. Consequently, the stray light carriers can be further prevented from being absorbed by the light receiving portion, so that signals of optical recording media can be more precisely output.

An optical semiconductor device according to a second aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; and a stray light carrier absorbing region provided at least in an area posterior to the light source on a bottom surface of the concave portion when a signal detecting light emitting side of the light source is a front side.

According to this structure, the stray light carriers generated due to the intrusion of the stray light (not only direct light but also reflected light is included) emitted from the rear surface of the light source so as to spread over a wide area into the semiconductor substrate at least through the area posterior to the light source on the bottom surface of the concave portion can be absorbed by the stray light carrier absorbing region. Consequently, the stray light carriers can be prevented from being absorbed by the light receiving portion, so that signals of optical recording media can be more precisely output.

In the above-described structure, by forming the stray light carrier absorbing region also in an area obliquely posterior to the light source on the bottom surface of the concave portion, the stray light carriers generated due to the intrusion of the stray light into the semiconductor substrate through the area obliquely posterior to the light source on the bottom surface of the concave portion can be absorbed by the stray light carrier absorbing region. Consequently, the stray light carriers can be further prevented from being absorbed by the light receiving portion, so that signals of optical recording media can be more precisely output.

Further, by forming the stray light carrier absorbing region in an area surrounding the light source on all sides on the bottom surface of the concave portion, the stray light carriers generated due to the intrusion of the stray light into the semiconductor substrate through the area surrounding the light source on all sides on, the bottom surface of the concave portion can be absorbed by the stray light carrier absorbing region. In this case, the stray light carriers generated due to the intrusion of the stray light emitted from the front surface of the light source so as to spread over a wide area into the semiconductor substrate through an area in front of the concave portion on the bottom surface of the concave portion can be also absorbed by the stray light carrier absorbing region. Consequently, the stray light carriers can be further prevented from being absorbed by the light receiving portion, so that signals of optical recording media can be more precisely output.

An optical semiconductor device according to a third aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; a first light intercepting region provided at least in an area posterior to the light source on a bottom surface of the concave portion when a signal detecting light emitting side of the light source is a front side; and a second light intercepting region provided at least on, of side surfaces of the concave portion, a side surface between the light source and the light receiving portion.

According to this structure, the stray light (not only direct light but also reflected light is included) emitted from the rear surface of the light source so as to spread over a wide area is prevented by the first light intercepting region from intruding into the semiconductor substrate at least through the area posterior to the light source on the bottom surface of the concave portion, so that the generation of stray light carriers due to the intrusion of the stray light into the semiconductor substrate can be suppressed. Moreover, the stray light emitted from the light source is prevented by the second light intercepting region from intruding into the semiconductor substrate through, of the side surfaces of the concave portion, the side surface between the light source and the light receiving portion, so that the generation of stray light carriers due to the intrusion of the stray light into the semiconductor substrate can be suppressed. In this case, the stray light emitted from the front surface of the light source so as to spread over a wide area can be also prevented by the second light intercepting region from intruding into the semiconductor substrate through, of the side surfaces of the concave portion, the side surface between the light source and the light receiving portion. Consequently, the stray light carriers can be prevented from being absorbed by the light receiving portion, so that signals of optical recording media can be more precisely output.

In the above-described structure, by forming the first light intercepting region also in an area obliquely posterior to the light source on the bottom surface of the concave portion, the stray light is prevented from intruding into the semiconductor substrate through the area obliquely posterior to the light source on the bottom surface of the concave portion, so that the generation of stray light carriers due to the intrusion of the stray light into the semiconductor substrate can be further suppressed. Consequently, the stray light carriers can be further prevented from being absorbed by the light receiving portion, so that signals of optical recording media can be more precisely output.

Further, by forming the first light intercepting region in an area surrounding the light source on all sides on the bottom surface of the concave portion, the stray light is prevented from intruding into the semiconductor substrate through the area surrounding the light source on all sides on the bottom surface of the concave portion, so that the generation of stray light carriers due to the intrusion of the stray light into the semiconductor substrate can be further suppressed. In this case, the stray light emitted from the front surface of the light source so as to spread over a wide area can be also prevented by the first light intercepting region from intruding into the semiconductor substrate through an area in front of the concave portion on the bottom surface of the concave portion. Consequently, the stray light carriers can be further prevented from being absorbed by the light receiving portion, so that signals of optical recording media can be more precisely output.

An optical semiconductor device according to a fourth aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; a first stray light carrier absorbing region provided at least in an area posterior to the light source on a bottom surface of the concave portion when a signal detecting light emitting side of the light source is a front side; and a second stray light carrier absorbing region provided at least in an area between the light source and the light receiving portion on the semiconductor substrate.

According to this structure, the stray light carriers generated due to the intrusion of the stray light (not only direct light but also reflected light is included) emitted from the rear surface of the light source so as to spread over a wide area into the semiconductor substrate from at least the area posterior to the light source on the bottom surface of the concave portion can be absorbed by the first stray light carrier absorbing region. Moreover, the stray light carriers generated due to the intrusion of the stray light emitted from the light source into the semiconductor substrate through, of the side surfaces of the concave portion, the side surface between the light source and the light receiving portion can be absorbed by the second stray light carrier absorbing region. In this case, the stray light carriers generated due to the intrusion of the stray light emitted from the front surface of the light source so as to spread over a wide area into the semiconductor substrate through, of the side surfaces of the concave portion, the side surface between the light source and the light receiving portion can be also absorbed by the second stray light carrier absorbing region. Consequently, the stray light carriers can be prevented from being absorbed by the light receiving portion, so that signals of optical recording media can be more precisely output.

In the above-described structure, by forming the first stray light carrier absorbing region also in an area obliquely posterior to the light source on the bottom surface of the concave portion, the stray light carriers generated due to the intrusion of the stray light into the semiconductor substrate through the area obliquely posterior to the light source on the bottom surface of the concave portion can be absorbed by the first stray light carrier absorbing region. Consequently, the stray light carriers can be further prevented from being absorbed by the light receiving portion, so that signals of optical recording media can be more precisely output.

Further, by forming the first stray light carrier absorbing region in an area surrounding the light source on all sides on the bottom surface of the concave portion, the stray light carriers generated due to the intrusion of the stray light into the semiconductor substrate through the area surrounding the light source on all sides on the bottom surface of the concave portion can be absorbed by the first stray light carrier absorbing region. In this case, the stray light carriers generated due to the intrusion of the stray light emitted from the front surface of the light source so as to spread over a wide area into the semiconductor substrate through an area in front of the concave portion on the bottom surface of the concave portion can be also absorbed by the first stray light carrier absorbing region. Consequently, the stray light carriers can be further prevented from being absorbed by the light receiving portion, so that signals of optical recording media can be more precisely output.

Further, by forming the second stray light carrier absorbing region also in an area posterior to the concave portion on the surface of the semiconductor substrate so as to serve also as a monitor region for detecting the quantity of the signal detecting light from the light source, the quantity of the signal detecting light from the light source can be detected by the second stray light carrier absorbing region. Consequently, it is unnecessary to provide an independent monitor region, so that the structure is simplified.

An optical semiconductor device according to a fifth aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; and a monitor region provided on the surface of the semiconductor substrate for detecting a quantity of the signal detecting light from the light source and absorbing stray light.

According to this structure, the stray light carriers generated due to the intrusion of the stray light (not only direct light but also reflected light is included) emitted from the rear surface of the light source so as to spread over a wide area into the semiconductor substrate through the surface of the semiconductor substrate can be absorbed by the monitor region. Consequently, the stray light carriers can be prevented from being absorbed by the light receiving portion, so that signals of optical recording media can be more precisely output.

In the above-described structure, by forming the monitor region also in an area in the periphery of the concave portion on the surface of the semiconductor substrate, the stray light carriers generated due to the intrusion of the stray light into the semiconductor substrate through the surface of the semiconductor substrate can be effectively absorbed by the stray light carrier absorbing region. Consequently, the stray light carriers can be further prevented from being absorbed by the light receiving portion, so that signals of optical recording media can be more precisely output.

Further, by forming the monitor region in a U shape in an area in the periphery of the concave portion on the surface of the semiconductor substrate so as to surround the light source on the rear side and the left and right sides, the stray light carriers generated due to the intrusion of the stray light into the semiconductor substrate through the surface of the semiconductor substrate can be more effectively absorbed by the monitor region. In this case, the stray light carriers generated due to the intrusion of the stray light emitted from the front surface of the light source so as to spread over a wide area into the semiconductor substrate through, of the side surfaces of the concave portion, the side surface between the light source and the light receiving portion can be also absorbed by the stray light carrier absorbing region. Consequently, the stray light carriers can be further prevented from being absorbed by the light receiving portion, so that signals of optical recording media can be more precisely output.

An optical semiconductor device according to a sixth aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; a light intercepting region provided at least in an area posterior to the light source on a bottom surface of the concave portion when a signal detecting light emitting side of the light source is a front side; and a monitor region provided on the surface of the semiconductor substrate for detecting a quantity of the signal detecting light from the light source and absorbing stray light.

According to this structure, the stray light (not only direct light but also reflected light is included) emitted from the rear surface of the light source so as to spread over a wide area is prevented by the light intercepting region from intruding into the semiconductor substrate at least through the area posterior to the light source on the bottom surface of the concave portion, so that the generation of stray light carriers due to the intrusion of the stray light into the semiconductor substrate can be suppressed. Moreover, the stray light carriers generated due to the intrusion of the stray light (not only direct light but also reflected light is included) emitted from the rear surface of the light source so as to spread over a wide area into the semiconductor substrate through the surface of the semiconductor substrate can be absorbed by the monitor region. Consequently, the stray light carriers can be prevented from being absorbed by the light receiving portion, so that signals of optical recording media can be more precisely output.

In the above-described structure, by forming the monitor region also in an area in the periphery of the concave portion on the surface of the semiconductor substrate, the stray light carriers generated due to the intrusion of the stray light into the semiconductor substrate through the surface of the semiconductor substrate can be absorbed by the stray light carrier absorbing region. Consequently, the stray light carriers can be further prevented from being absorbed by the light receiving portion, so that signals of optical recording media can be more precisely output.

Further, by forming the monitor region in a U shape in an area in the periphery of the concave portion on the surface of the semiconductor substrate so as to surround the light source on the rear side and the left and right sides, the stray light carriers generated due to the intrusion of the stray light into the semiconductor substrate through the surface of the semiconductor substrate can be absorbed by the monitor region. In this case, the stray light carriers generated due to the intrusion of the stray light emitted from the front surface of the light source so as to spread over a wide area into the semiconductor substrate through, of the side surfaces of the concave portion, the side surface between the light source and the light receiving portion can be also absorbed by the monitor region. Consequently, the stray light carriers can be further prevented from being absorbed by the light receiving portion, so that signals of optical recording media can be more precisely output.

Further, by forming the light intercepting region also in an area obliquely posterior to the light source on the bottom surface of the concave portion, the stray light is prevented from intruding into the semiconductor substrate through the area obliquely posterior to the light source on the bottom surface of the concave portion, so that the generation of stray light carriers due to the intrusion of the stray light into the semiconductor substrate can be further suppressed. Consequently, the stray light carriers can be further prevented from being absorbed by the light receiving portion, so that signals of optical recording media can be more precisely output.

Further, by forming the light intercepting region in an area surrounding the light source on all sides on the bottom surface of the concave portion, the stray light is prevented from intruding into the semiconductor substrate through the area surrounding the light source on all sides on the bottom surface of the concave portion, so that the generation of stray light carriers due to the intrusion of the stray light into the semiconductor substrate can be further suppressed. In this case, the stray light emitted from the front surface of the light source so as to spread over a wide area can be also prevented by the light intercepting region from intruding into the semiconductor substrate through an area in front of the concave portion on the bottom surface of the concave portion. Consequently, the stray light carriers can be further prevented from being absorbed by the light receiving portion, so that signals of optical recording media can be more precisely output.

An optical semiconductor device according to a seventh aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; a stray light carrier absorbing region provided at least in an area posterior to the light source on the bottom surface of the concave portion when a signal detecting light emitting side of the light source is a front side; and a monitor region provided on the surface of the semiconductor substrate for detecting a quantity of the signal detecting light from the light source and absorbing stray light.

According to this structure, the stray light carriers generated due to the intrusion of the stray light (not only direct light but also reflected light is included) emitted from the rear surface of the light source so as to spread over a wide area into the semiconductor substrate at least through the area posterior to the light source on the bottom surface of the concave portion can be absorbed by the stray light carrier absorbing region. Moreover, the stray light carriers generated due to the intrusion of the stray light (not only direct light but also reflected light is included) emitted from the rear surface of the light source so as to spread over a wide area into the semiconductor substrate through the surface of the semiconductor substrate can be absorbed by the monitor region. Consequently, the stray light carriers can be prevented from being absorbed by the light receiving portion, so that signals of optical recording media can be more precisely output.

In the above-described structure, by forming the monitor region also in an area in the periphery of the concave portion on the surface of the semiconductor substrate, the stray light carriers generated due to the intrusion of the stray light into the semiconductor substrate through the surface of the semiconductor substrate can be absorbed by the monitor region. Consequently, the stray light carriers can be further prevented from being absorbed by the light receiving portion, so that signals of optical recording media can be more precisely output.

Further, by forming the monitor region in a U shape in an area in the periphery of the concave portion on the surface of the semiconductor substrate so as to surround the light source on the rear side and the left and right sides, the stray light carriers generated due to the intrusion of the stray light into the semiconductor substrate through the surface of the semiconductor substrate can be absorbed by the monitor region. In this case, the stray light carriers generated due to the intrusion of the stray light emitted from the front surface of the light source so as to spread over a wide area into the semiconductor substrate through, of the side surfaces of the concave portion, the side surface between the light source and the light receiving portion can be also absorbed by the monitor region. Consequently, the stray light carriers can be further prevented from being absorbed by the light receiving portion, so that signals of optical recording media can be more precisely output.

Further, by forming the stray light carrier absorbing region also in an area obliquely posterior to the light source on the bottom surface of the concave portion, the stray light carriers generated due to the intrusion of the stray light into the semiconductor substrate through the area obliquely posterior to the light source on the bottom surface of the concave portion can be absorbed by the stray light carrier absorbing region. Consequently, the stray light carriers can be further prevented from being absorbed by the light receiving portion, so that signals of optical recording media can be more precisely output.

Further, by forming the stray light carrier absorbing region in an area surrounding the light source on all sides on the bottom surface of the concave portion, the stray light carriers generated due to the intrusion of the stray light into the semiconductor substrate through the area surrounding the light source on all sides on the bottom surface of the concave portion can be absorbed by the stray light carrier absorbing region. In this case, the stray light carriers generated due to the intrusion of the stray light emitted from the front surface of the light source so as to spread over a wide area into the semiconductor substrate through an area in front of the concave portion on the bottom surface of the concave portion can be also absorbed by the stray light carrier absorbing region. Consequently, the stray light carriers can be further prevented from being absorbed by the light receiving portion, so that signals of optical recording media can be more precisely output.

An optical semiconductor device according to an eighth aspect of the invention is provided with: a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; a light intercepting region provided at least in an area posterior to the light source on a bottom surface of the concave portion when a signal detecting light emitting side of the light source is a front side; and a stray light carrier absorbing region provided at least in an area between the light source and the light receiving portion on the semiconductor substrate.

According to this structure, the stray light (not only direct light but also reflected light is included) emitted from the rear surface of the light source so as to spread over a wide area is prevented by the light intercepting region from intruding into the semiconductor substrate at least through the area posterior to the light source on the bottom surface of the concave portion, so that the generation of stray light carriers due to the intrusion of the stray light into the semiconductor substrate can be suppressed. Moreover, the stray light carriers generated due to the intrusion of the stray light emitted from the light source into the semiconductor substrate through, of the side surfaces of the concave portion, the side surface between the light source and the light receiving portion can be absorbed by the stray light carrier absorbing region. In this case, the stray light carriers generated due to the intrusion of the stray light emitted from the front surface of the light source so as to spread over a wide area into the semiconductor substrate through, of the side surfaces of the concave portion, the side surface between the light source and the light receiving portion can be also absorbed by the stray light carrier absorbing region. Consequently, the stray light carriers can be further prevented from being absorbed by the light receiving portion, so that signals of optical recording media can be more precisely output.

In the above-described structure, by forming the light intercepting region also in an area obliquely posterior to the light source on the bottom surface of the concave portion, the stray light is prevented from intruding into the semiconductor substrate through the area obliquely posterior to the light source on the bottom surface of the concave portion, so that the generation of stray light carriers due to the intrusion of the stray light into the semiconductor substrate can be further suppressed. Consequently, the stray light carriers can be further prevented from being absorbed by the light receiving portion, so that signals of optical recording media can be more precisely output.

Further, by forming the light intercepting region in an area surrounding the light source on all sides on the bottom surface of the concave portion, the stray light is prevented from intruding into the semiconductor substrate through the area surrounding the light source on all sides on the bottom surface of the concave portion, so that the generation of stray light carriers due to the intrusion of the stray light into the semiconductor substrate can be further suppressed. In this case, the stray light emitted from the front surface of the light source so as to spread over a wide area can be also prevented by the light intercepting region from intruding into the semiconductor substrate through an area in front of the concave portion on the bottom surface of the concave portion. Consequently, the stray light carriers can be further prevented from being absorbed by the light receiving portion, so that signals of optical recording media can be more precisely output.

Further, by forming the stray light carrier absorbing region also in the area posterior to the concave portion on the surface of the semiconductor substrate so as to serve also as a monitor region for detecting the quantity of the signal detecting light from the light source, the quantity of the signal detecting light from the light source can be detected by the stray light carrier absorbing region. Consequently, it is unnecessary to provide an independent monitor region, so that the structure is simplified.

An optical semiconductor device according to a ninth aspect of the invention is provided with a light source comprising a semiconductor laser element and emitting signal detecting light; a semiconductor substrate wherein the light source is mounted in a concave portion provided on a surface of the semiconductor substrate so that an optical axis of the signal detecting light from the light source is substantially parallel to the surface of the semiconductor substrate, and the signal detecting light from the light source is reflected at a side surface of the concave portion in a direction substantially perpendicular to the surface of the semiconductor substrate; at least one light receiving portion provided in an area outside the concave portion on the surface of the semiconductor substrate; a stray light carrier absorbing region provided at least in an area posterior to the light source on a bottom surface of the concave portion when a signal detecting light emitting side of the light source is a front side; and a light intercepting region provided at least on, of side surfaces of the concave portion, a side surface between the light source and the light receiving portion.

According to this structure, the stray light carriers generated due to the intrusion of the stray light (not only direct light but also reflected light is included) emitted from the rear surface of the light source so as to spread over a wide area into the semiconductor substrate at least through the area posterior to the light source on the bottom surface of the concave portion can be absorbed by the stray light carrier absorbing region. Moreover, the stray light emitted from the light source is prevented by the light intercepting region from intruding into the semiconductor substrate through, of the side surfaces of the concave portion, the side surface between the light source and the light receiving portion, so that the generation of stray light carriers due to the intrusion of the stray light into the semiconductor substrate can be suppressed. In this case, the stray light emitted from the front surface of the semiconductor substrate so as to spread over a wide area can be also prevented by the light intercepting region from intruding into the semiconductor substrate through, of the side surfaces of the concave portion, the side surface between the light source and the light receiving portion. Consequently, the stray light carriers can be prevented from being absorbed by the light receiving portion, so that signals of optical recording media can be more precisely output.

In the above-described structure, by forming the stray light carrier absorbing region also in an area obliquely posterior to the light source on the bottom surface of the concave portion, the stray light carriers generated due to the intrusion of the stray light into the semiconductor substrate through the area obliquely posterior to the light source on the bottom surface of the concave portion can be absorbed by the stray light carrier absorbing region. Consequently, the stray light carriers can be further prevented from being absorbed by the light receiving portion, so that signals of optical recording media can be more precisely output.

Further, by forming the stray light carrier absorbing region in an area surrounding the light source on all sides on the bottom surface of the concave portion, the stray light carriers generated due to the intrusion of the stray light into the semiconductor substrate through the area surrounding the light source on all sides on the bottom surface of the concave portion can be absorbed by the stray light carrier absorbing region. In this case, the stray light carriers generated due to the intrusion of the stray light emitted from the front surface of the light source so as to spread over a wide area into the semiconductor substrate through an area in front of the concave portion on the bottom surface of the concave portion can be also absorbed by the stray light carrier absorbing region. Consequently, the stray light carriers can be further prevented from being absorbed by the light receiving portion, so that signals of optical recording media can be more precisely output.

DESCRIPTION OF THE PREFERRED EMBODIMENTS

First Embodiment

Figure 1:
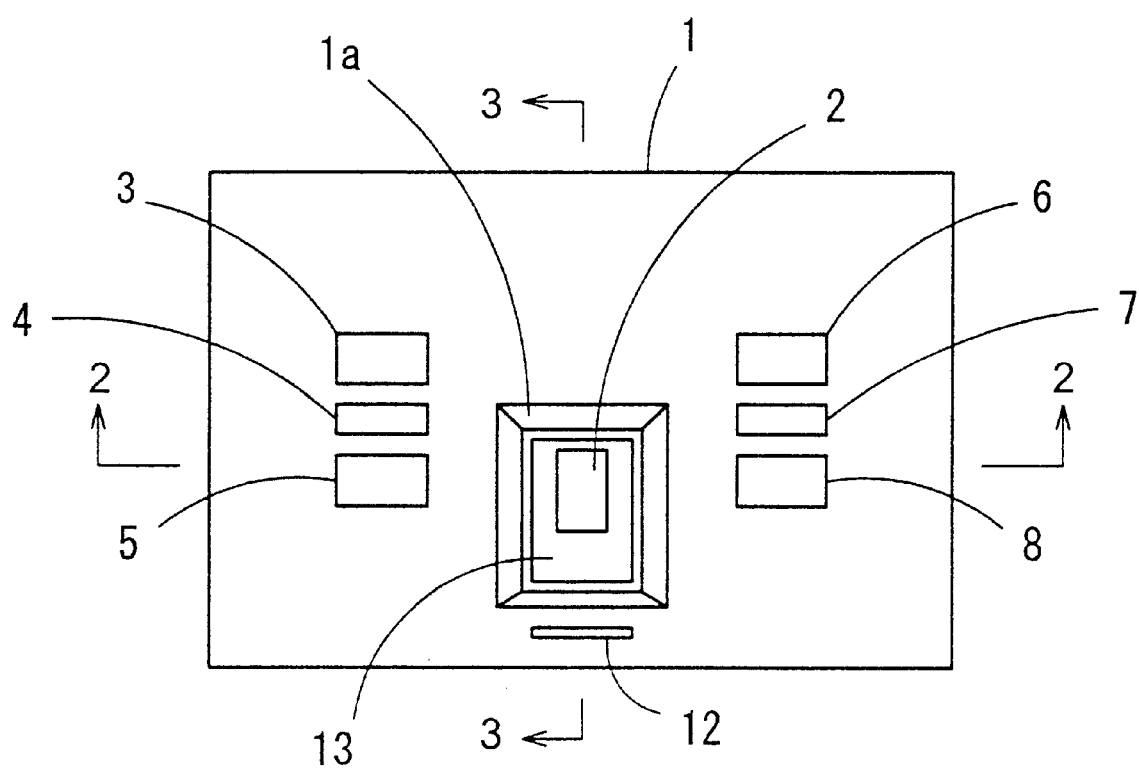
FIG. 1 is a plan view showing the structure of an optical semiconductor device according to a first embodiment of the present invention.
Figure 4:
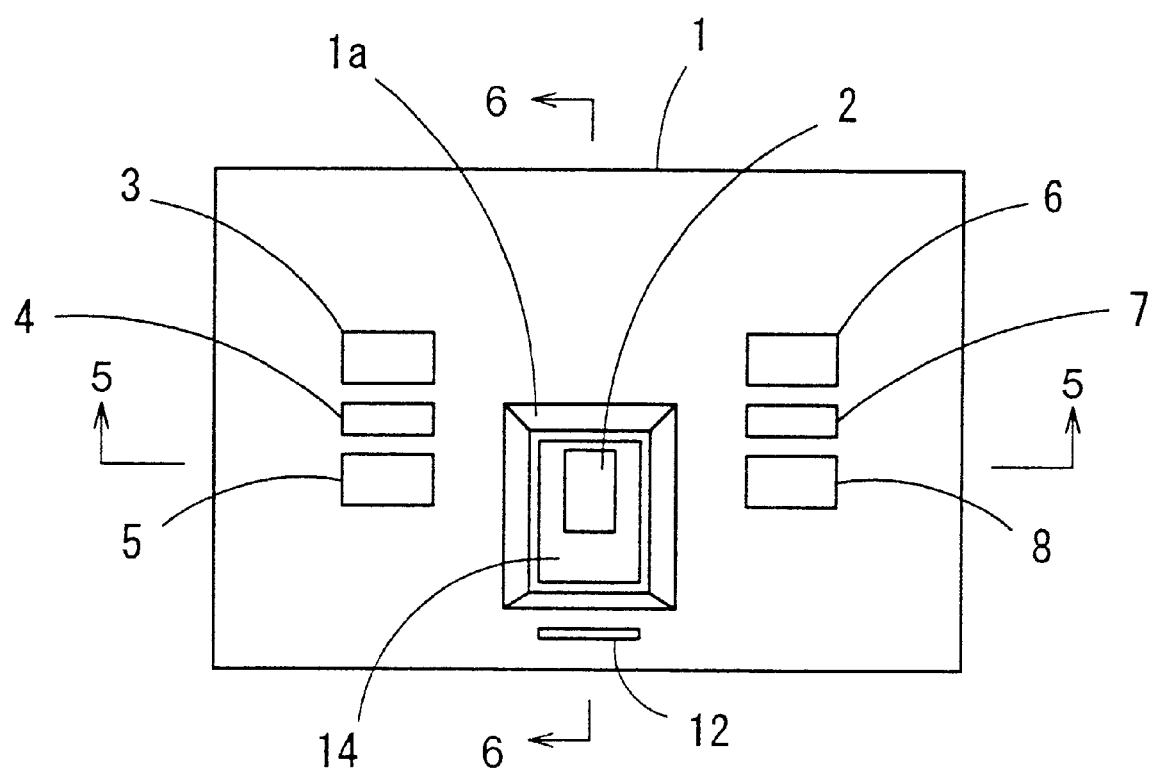
FIG. 4 is a plan view showing the structure of an optical semiconductor device according to a second embodiment of the present invention.
Figure 5:
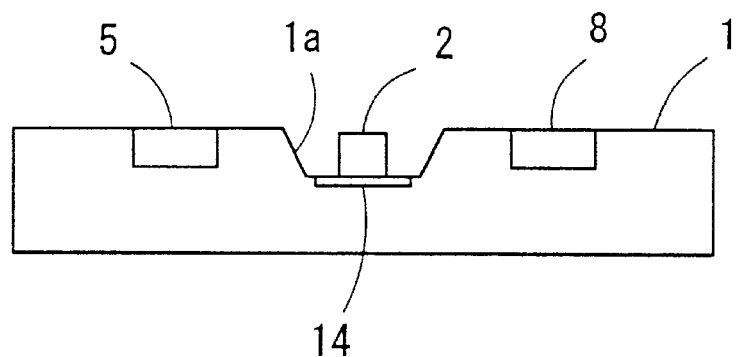
FIG. 5 is a cross-sectional view showing the structure of the optical semiconductor device.
Figure 6:
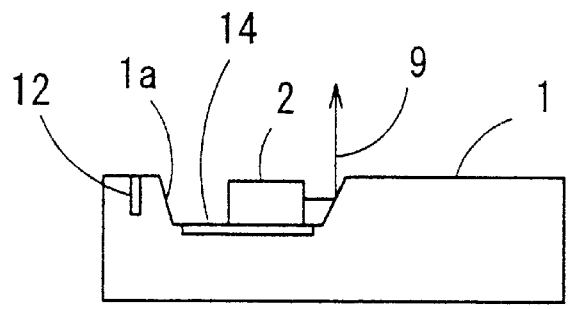
FIG. 6 is a cross-sectional view showing the structure of the optical semiconductor device.

A first embodiment of the present invention will be described with reference to the drawings. FIG. 1 is a plan view schematically showing a plane layout of an optical semiconductor device according to the first embodiment of the present invention. FIG. 5 is a cross-sectional view schematically showing the cross section of FIG. 4 taken on the line 5—5. FIG. 6 is a cross-sectional view schematically showing the cross section of FIG. 5 taken on the line 6—6.

Figure 2:
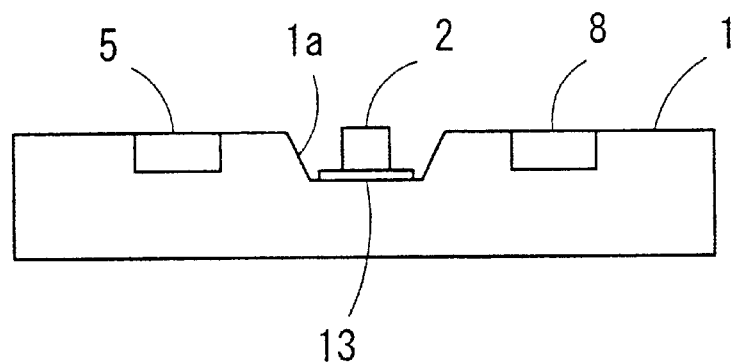
FIG. 2 is a cross-sectional view showing the structure of the optical semiconductor device.
Figure 3:
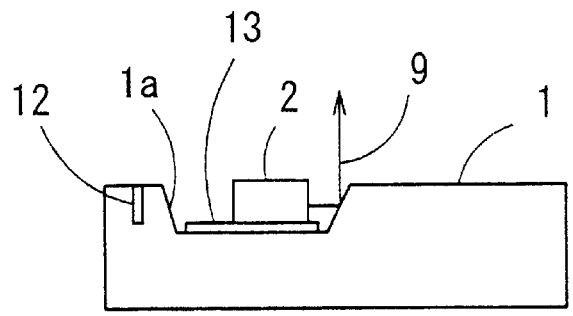
FIG. 3 is a cross-sectional view showing the structure of the optical semiconductor device.

In FIGS. 1, 2 and 3, a semiconductor substrate 1 is made of, for example, Si, and has a rectangular concave portion 1*a* on the surface thereof. A semiconductor laser element 2 is made of, for example, GaAs, and acts as a light source for emitting signal detecting light. The semiconductor laser element 2 is mounted in the concave portion 1*a* so that the optical axis of the signal detecting light is substantially parallel to the surface of the semiconductor substrate 1, and is integrated with the semiconductor substrate 1.

The concave portion 1a is formed so that the signal detecting light from the semiconductor laser element 2 is reflected at the inclined side surface of the concave portion 1a that is opposed to the signal detecting light emitting side of the semiconductor laser element 2 in the direction substantially perpendicular to the surface of the semiconductor substrate 1. In the part of the bottom surface of the concave portion 1a where the semiconductor laser element 2 is mounted, one electrode for applying a voltage to the semiconductor laser element 2 is formed. The other electrode of the semiconductor laser element 2 is formed on the top surface of the semiconductor laser element 2.

Light receiving portions 3 to 8 for signal detection are, for example, impurity diffused regions, and are formed outside the concave portion 1a on the surface of the semiconductor substrate 1. For example, when the signal detecting light emitting side of the semiconductor laser element 2 on the surface of the semiconductor substrate 1 is the front side of the semiconductor laser element 2, the light receiving portions 3 to 8 are selectively formed at the left and right sides of the concave portion 1a.

The semiconductor substrate 1 and the light receiving portions 3 to 8 are opposite in conductivity type. Between the semiconductor substrate 1 and the light receiving portions 3 to 8, a voltage that causes a reverse bias is applied.

A monitor region 12 is, for example, an impurity diffused region, is disposed in the rear of the concave portion 1a on the surface of the semiconductor substrate 1, and detects the quantity of the signal detecting light from the semiconductor laser element 2. The semiconductor substrate 1 and the monitor region 12 are opposite in conductivity type. Between the semiconductor substrate 1 and the monitor region 12, a voltage that causes a reverse bias is applied. The impurity concentration of the monitor region 12 is approximately the same as that of the light receiving portions 3 to 8. The above-described structure is the same as the structure of the conventional example.

A light intercepting region 13 is made of a high-reflectance material, and is disposed on the bottom surface of the concave portion 1a. The light intercepting region 13 prevents the stray light emitted from the semiconductor laser element 2, particularly the stray light (direct light or reflected light) emitted from the rear surface of the semiconductor laser element 2 from intruding into the semiconductor substrate 1 through the bottom surface of the concave portion 1a, thereby suppressing the generation of stray light carriers in the periphery of the concave portion 1a on the surface of the semiconductor substrate 1. This embodiment is different from the conventional example in that the light intercepting region 13 is provided.

The light intercepting region 13 is formed in the form of, for example, a specular reflection film by depositing, for example, Au on the semiconductor substrate 1 made of, for example, Si. It is preferable that the thickness of this region be not less than $0.3\,\mu m$, although a thickness of a degree that does not transmit light is enough. With respect to the reflectance of this region, since it is preferable that no light be incident on the substrate, a higher reflectance is more desirable; it is preferable that the reflectance be not less than 95%.

While the light intercepting region 13 is made of a metal film and acts also as one electrode of the previously described semiconductor laser element 2, it may be formed separately from the electrode of the semiconductor laser element 2.

While the light intercepting region 13 is formed immediately below and in the periphery of the semiconductor laser element 2 because it acts also as one electrode of the semiconductor laser element 2, when it is formed separately from the electrode of the semiconductor laser element 2, it may be formed only in the periphery of the semiconductor laser element 2.

Moreover, when formed only in an area posterior the semiconductor laser element 2 on the bottom surface of the concave portion 1a, the light intercepting region 13 is also effective in suppressing the generation of the stray light carriers by preventing the stray light emitted from the rear surface of the semiconductor laser element 2 or the reflected light thereof from intruding into the semiconductor substrate 1 through the concave portion 1a.

Moreover, forming the light intercepting region 13 also in an area obliquely posterior to the semiconductor laser element 2 on the bottom surface of the concave portion 1a is more effective in suppressing the generation of the stray light carriers than forming the light intercepting region 13 only in a posterior area.

Moreover, forming the light intercepting region 13 in an area surrounding the semiconductor laser element 2 on all sides on the bottom surface of the concave portion 1a is more effective in suppressing the generation of the stray light carriers than forming the light intercepting region 13 only in areas posterior to and obliquely posterior to the semiconductor laser element 2. That is, by doing this, the stray light emitted from the front surface of the semiconductor laser element 2 so as to spread over a wide area can be prevented by the light intercepting region 13 from intruding into the semiconductor substrate 1 through an area in front or at a side of the concave portion 1a on the bottom surface of the concave portion 1a.

The operation of the optical semiconductor device according to this embodiment structured as described above will be described.

First, stray light is generated simultaneously with the emission of the signal detecting light from the semiconductor laser element 2 on the semiconductor substrate 1, and the stray light tries to be incident on the bottom surface of the concave portion 1a. However, the provision of the light intercepting region 13 on the bottom surface of the concave portion 1aprevents the stray light from intruding into the semiconductor substrate 1 through the bottom surface of the concave portion 1a. This suppresses the generation of stray light carriers in the semiconductor substrate 1 in the periphery of the concave portion 1a on the surface of the semiconductor substrate 1 due to the intrusion of the stray light into the semiconductor substrate 1. The basic operation is similar to that of the conventional example.

As described above, according to the first embodiment, the light intercepting region 13 prevents the stray light from intruding into the semiconductor substrate 1 through the bottom surface of the concave portion 1a of the semiconductor substrate 1, so that the generation of stray light carriers in the periphery of the concave portion 1a on the surface of the semiconductor substrate 1 can be suppressed. Consequently, stray light carriers are prevented from being absorbed by the light receiving portions 3 to 8, so that signals of optical recording media can be more precisely output.

Second Embodiment

A second embodiment of the present invention will be described with reference to the drawings. FIG. 4 is a plan view schematically showing a plane layout of an optical semiconductor device according to the second embodiment of the present invention. FIG. 5 is a cross-sectional view schematically showing the cross section of FIG. 4 taken on the line 5—5. FIG. 6 is a cross-sectional view schematically showing the cross section of FIG. 5 taken on the line 6—6.

In FIGS. 4, 5 and 6, a semiconductor substrate 1 is made of, for example, Si, and has a rectangular concave portion 1a on the surface thereof. A semiconductor laser element 2 is made of, for example, GaAs, and acts as a light source for emitting signal detecting light. The semiconductor laser element 2 is mounted in the concave portion 1a so that the optical axis of the signal detecting light is substantially parallel to the surface of the semiconductor substrate 1, and is integrated with the semiconductor substrate 1.

The concave portion 1a is formed so that the signal detecting light from the semiconductor laser element 2 is reflected at the inclined side surface of the concave portion 1a that is opposed to the signal detecting light emitting side of the semiconductor laser element 2 in the direction substantially perpendicular to the surface of the semiconductor substrate 1. In the part of the bottom surface of the concave portion 1a where the semiconductor laser element 2 is mounted, one electrode for applying a voltage to the semiconductor laser element 2 is formed. The other electrode of the semiconductor laser element 2 is formed on the top surface of the semiconductor laser element 2.

Light receiving portions 3 to 8 for signal detection are, for example, impurity diffused regions, and are formed outside the concave portion 1a on the surface of the semiconductor substrate 1. For example, when the signal detecting light emitting side of the semiconductor laser element 2 on the surface of the semiconductor substrate 1 is the front side of the semiconductor laser element 2, the light receiving portions 3 to 8 are selectively formed at the left and right sides.

The semiconductor substrate 1 and the light receiving portions 3 to 8 are opposite in conductivity type. Between the semiconductor substrate 1 and the light receiving portions 3 to 8, a voltage that causes a reverse bias is applied.

A monitor region 12 is, for example, an impurity diffused region, is disposed in the rear of the concave portion 1a on the surface of the semiconductor substrate 1, and detects the quantity of the signal detecting light from the semiconductor laser element 2. The semiconductor substrate 1 and the monitor region 12 are opposite in conductivity type. Between the semiconductor substrate 1 and the monitor region 12, a voltage that causes a reverse bias is applied. The impurity concentration of the monitor region 12 is approximately the same as that of the light receiving portions 3 to 8. The above-described structure is the same as the structure of the conventional example.

A stray light carrier absorbing region 14 is, for example, an impurity diffused region, and is provided on the bottom surface of the concave portion 1a. The semiconductor substrate 1 and the stray light carrier absorbing region 14 are opposite in conductivity type. Between the semiconductor substrate 1 and the stray light carrier absorbing region 14, a voltage that causes a reverse bias is applied. In this case, by extending the depletion layer by applying a reverse bias to the stray light carrier absorbing region 14, holes are absorbed when the region is of p-type and electrons are absorbed when the region is of n-type.

The impurity concentration of the stray light carrier absorbing region 14 is approximately the same as that of the light receiving portions 3 to 8. The stray light carrier absorbing region 14 absorbs stray light carriers generated in the periphery of the concave portion 1a on the surface of the semiconductor substrate 1 due to the intrusion of the stray light generated from the semiconductor laser element 2, particularly the stray light (direct light or reflected light) emitted from the rear surface of the semiconductor laser element 2 into the semiconductor substrate 1 through the bottom surface of the concave portion 1a. This embodiment is different from the conventional example in that the stray light carrier absorbing region 14 is provided.

While the stray light carrier absorbing region 14 is formed immediately below and in the periphery of the semiconductor laser element 2, it may be formed only in the periphery of the semiconductor laser element 2.

Moreover, when formed only in an area posterior to the semiconductor laser element 2 on the bottom surface of the concave portion 1a, the stray light carrier absorbing region 14 is also effective in absorbing the stray light carriers generated due to the intrusion of the stray light emitted from the rear surface of the semiconductor laser element 2 or the reflected light thereof into the semiconductor substrate 1 through the concave portion 1a.

Moreover, forming the stray light carrier absorbing region 14 also in an area obliquely posterior to the semiconductor laser element 2 on the bottom surface of the concave portion 1a is more effective in absorbing the stray light carriers than forming the stray light carrier absorbing region 14 only in a posterior area.

Moreover, forming the stray light carrier absorbing region 14 in an area surrounding the semiconductor laser element 2 on all sides on the bottom surface of the concave portion 1a is more effective in absorbing the stray light carriers than forming the stray light carrier absorbing region 14 only in areas posterior to and obliquely posterior to the semiconductor laser element 2. That is, in this case, the stray light carriers generated due to the intrusion of the stray light emitted from the front surface of the semiconductor laser element 2 so as to spread over a wide area into the semiconductor substrate through an area in front or at a side of the concave portion 1a on the bottom surface of the concave portion 1a can be absorbed by the stray light carrier absorbing region 14.

The operation of the optical semiconductor device according to this embodiment structured as described above will be described.

First, stray light is generated simultaneously with the emission of the signal detecting light from the semiconductor laser element 2 on the semiconductor substrate 1, and the stray light is incident on the bottom surface of the concave portion 1a. However, by providing the stray light carrier absorbing region 14 on the bottom surface of the concave portion 1a, the stray light carriers can be absorbed that are generated in the periphery of the concave portion 1a on the surface of the semiconductor substrate 1 due to the intrusion of the stray light into the semiconductor substrate 1 through the bottom surface of the concave portion 1a. The basic operation is similar to that of the conventional example.

As described above, according to the second embodiment, the stray light carriers generated in the periphery of the concave portion 1a on the surface of the semiconductor substrate 1 due to the stray light intruding into the semiconductor substrate 1 through the bottom surface of the concave portion 1a of the semiconductor substrate 1 can be absorbed by the stray light carrier absorbing region 14. Consequently, stray light carriers are prevented from being absorbed by the light receiving portions 3 to 8, so that signals of optical recording media can be more precisely output.

Third Embodiment

Figure 7:
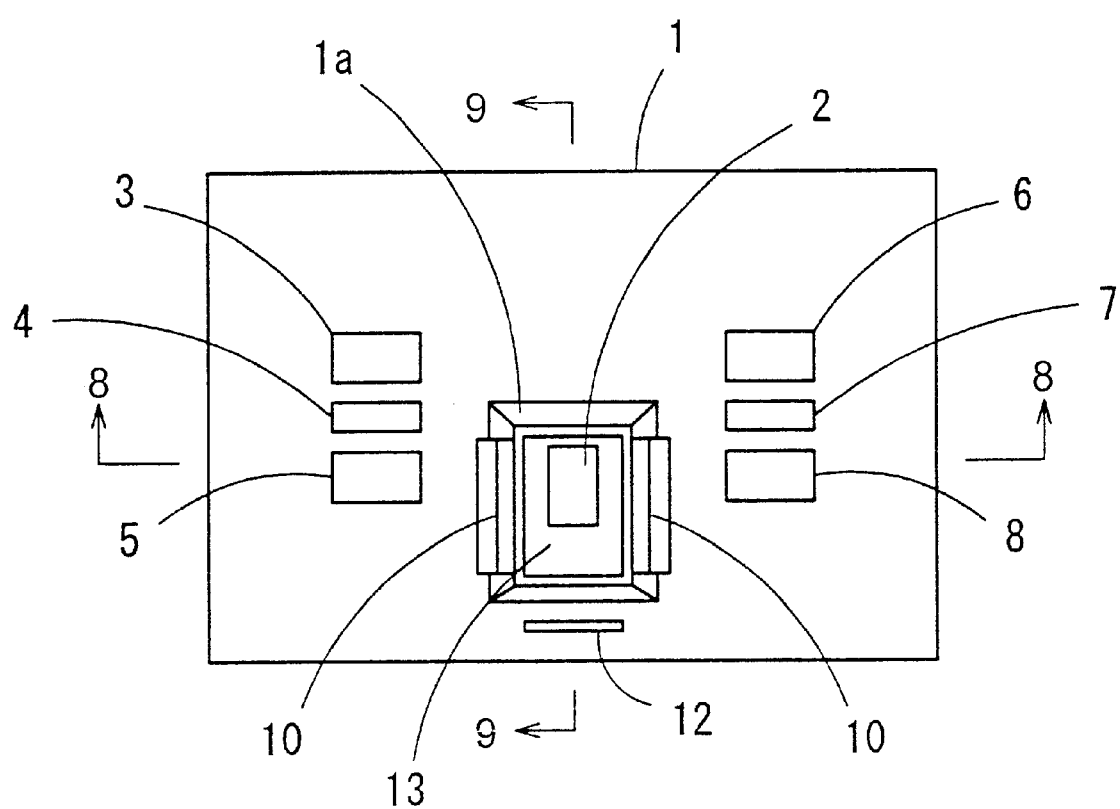
FIG. 7 is a plan view showing the structure of an optical semiconductor device according to a third embodiment of the present invention.
Figure 8:
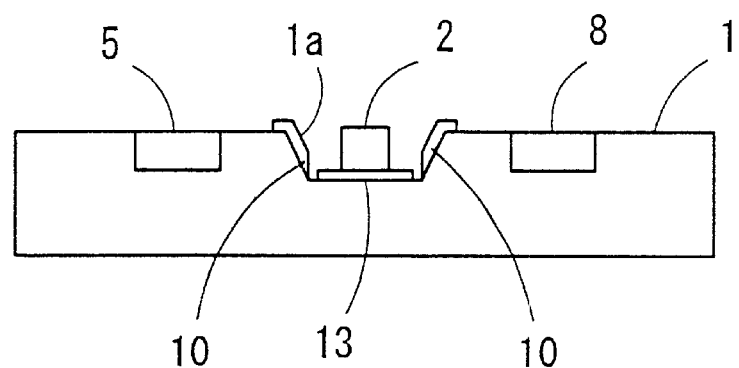
FIG. 8 is a cross-sectional view showing the structure of the optical semiconductor device.
Figure 9:
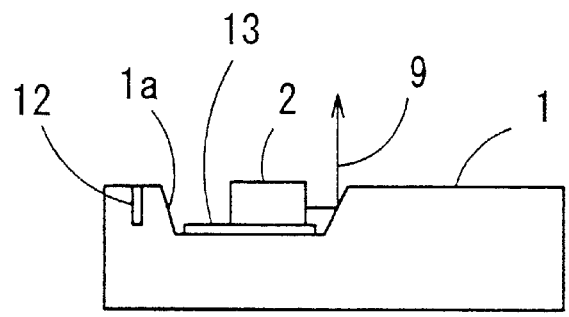
FIG. 9 is a cross-sectional view showing the structure of the optical semiconductor device.

A third embodiment of the present invention will be described with reference to the drawings. FIG. 7 is a plan view schematically showing a plane layout of an optical semiconductor device according to the third embodiment of the present invention. FIG. 8 is a cross-sectional view schematically showing the cross section of FIG. 7 taken on the line 8—8. FIG. 9 is a cross-sectional view schematically showing the cross section of FIG. 7 taken on the line 9—9.

In FIGS. 7, 8 and 9, light intercepting regions 10 are selectively provided on, of the side surfaces of the concave portion 1a, the side surfaces between the semiconductor laser element 2 and the light receiving portions 3 to 8 for signal detection, and are made of a high-reflectance material. The light intercepting regions 10 prevent the stray light generated from the semiconductor laser element 2, particularly the stray light (direct light or reflected light) generated from the rear surface of the semiconductor laser element 2 from intruding into the semiconductor substrate 1 through side surfaces of the concave portion 1a in the direction of the light receiving portions 3 to 8, thereby suppressing the generation of stray light carriers in the periphery of the concave portion 1a (that is, in the periphery of the light receiving portions 3 to 8) on the surface of the semiconductor substrate 1.

This embodiment is different from the first embodiment in that the light intercepting regions 10 are added. Except this, the structure is the same as that of the first embodiment.

The light intercepting regions 10 are formed in the form of, for example, specular reflection films by depositing, for example, Au on the semiconductor substrate 1 made of, for example, Si. It is preferable that the thickness of these regions be not less than 0.3 $\mu$m, although a thickness of a degree that does not transmit light is enough. With respect to the reflectance of these regions, since it is preferable that no light be incident on the substrate, a higher reflectance is more desirable; it is preferable that the reflectance be not less than 95%.

The operation of the optical semiconductor device according to this embodiment structured as described above will be described.

First, stray light is generated simultaneously with the emission of the signal detecting light from the semiconductor laser element 2 on the semiconductor substrate 1, and the stray light tries to be incident on side surfaces of the concave portion 1a. However, the provision of the light intercepting regions 10 on, of the four side surfaces of the rectangular concave portion 1a, the two side surfaces between the semiconductor laser element 2 and the light receiving portions 3 to 8 prevents the stray light from intruding into the semiconductor substrate 1 from the periphery of the light receiving portions 3 to 8. The generation of stray light carriers on the surface of the semiconductor substrate 1 in the periphery of the concave portion 1a (that is, in the periphery of the light receiving portions 3 to 8) on the surface of the semiconductor substrate 1 is suppressed.

Moreover, the intrusion of the stray light emitted from the front surface of the semiconductor laser element 2 so as to spread over a wide area into the semiconductor substrate 1 through, of the side surfaces of the concave portion 1a, the side surfaces between the semiconductor laser element 2 and the light receiving portions 3 to 8 can also be prevented by the light intercepting regions 10.

Except this, the operation is the same as that of the first embodiment.

As described above, according to the third embodiment, the intrusion of the stray light into the semiconductor substrate 1 through, of the side surfaces of the concave portion 1a of the semiconductor substrate 1, the side surfaces in the periphery the light receiving portions 3 to 8 is prevented by the light intercepting regions 10, so that the generation of the stray light carriers in the periphery of the concave portion 1a (that is, in the periphery of the light receiving portions 3 to 8) on the surface of the semiconductor substrate 1 can be suppressed. Consequently, stray light carriers are prevented from being absorbed by the light receiving portions 3 to 8 in the periphery of the concave portion 1a on the surface of the semiconductor substrate 1, so that signals of optical recording media can be more precisely output. Except this, the effects are the same as those of the first embodiment.

While the light intercepting regions 10 are added to the structure of the first embodiment in the above-described third embodiment, it is to be noted that effects the same as the above-described effects obtained by the provision of the light intercepting regions 10 are obtained when the light intercepting regions 10 are added to the structure of the conventional example.

Fourth Embodiment

Figure 10:
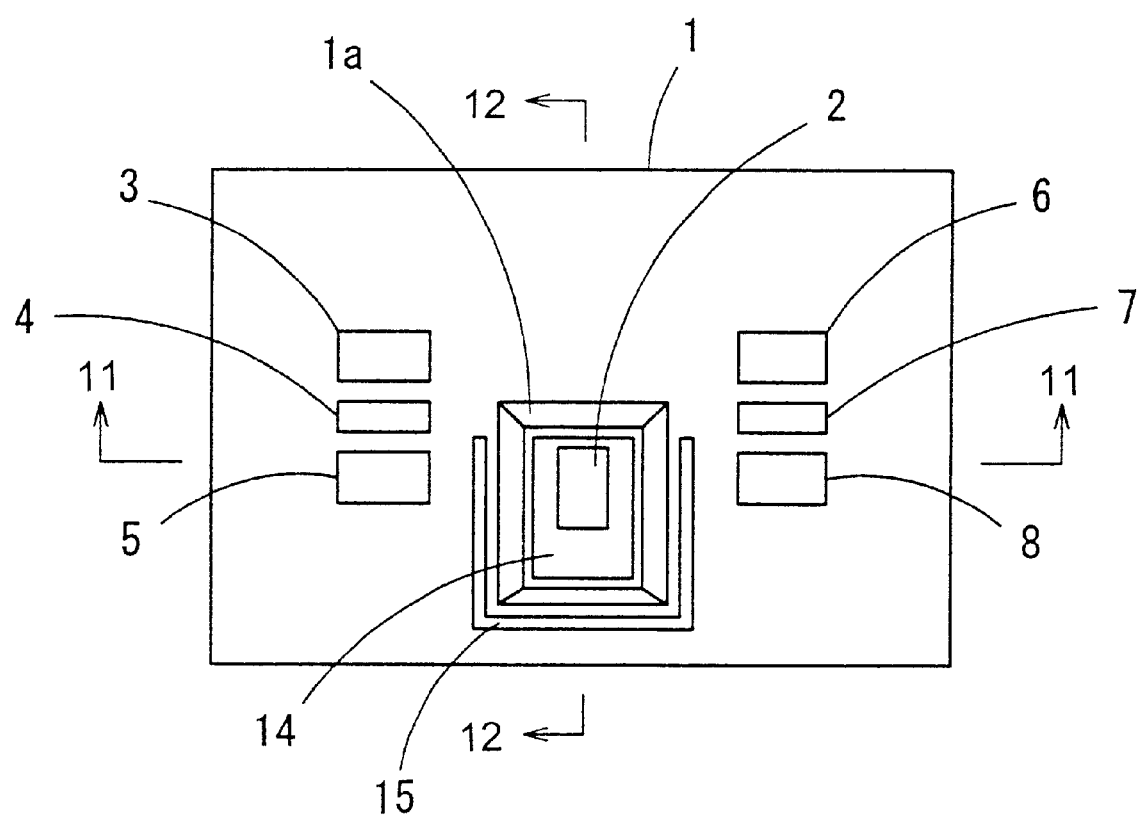
FIG. 10 is a plan view showing the structure of an optical semiconductor device according to a fourth embodiment of the present invention.
Figure 11:
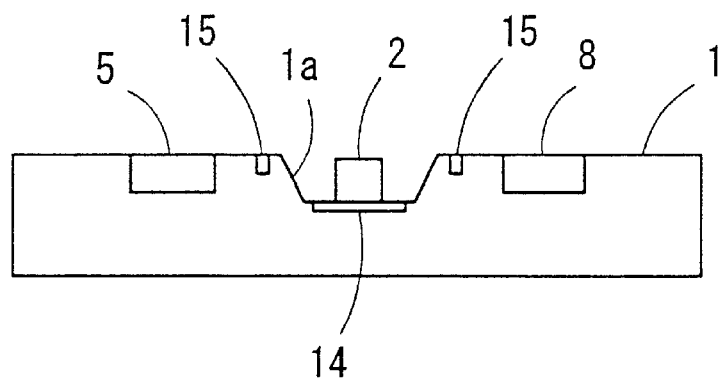
FIG. 11 is a cross-sectional view showing the structure of the optical semiconductor device.
Figure 12:
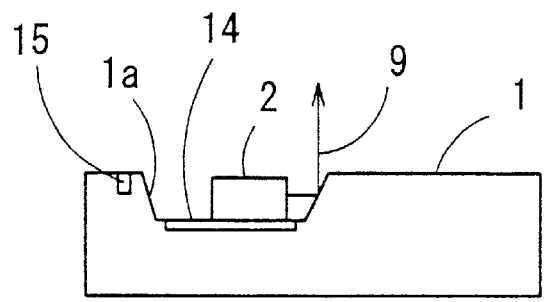
FIG. 12 is a cross-sectional view showing the structure of the optical semiconductor device.

A fourth embodiment of the present invention will be described with reference to the drawings. FIG. 10 is a plan view schematically showing a plane layout of an optical semiconductor device according to the fourth embodiment of the present invention. FIG. 11 is a cross-sectional view schematically showing the cross section of FIG. 10 taken on the line 11—11. FIG. 12 is a cross-sectional view schematically showing the cross section of FIG. 10 taken on the line 12—12.

In FIGS. 10, 11 and 12, a stray light carrier absorbing region 15 is selectively formed in areas between the semiconductor laser element 2 and the light receiving portions 3 to 8 for signal detection in the periphery of the concave portion 1a and in an area posterior to the semiconductor laser element 2 in the periphery of the concave portion 1a. That is, the stray light carrier absorbing region 15 are formed in a U shape so as to surround the semiconductor laser element 2 on the rear side and the left and right sides. Moreover, the stray light carrier absorbing region 15 is a diffusion region of the same conductivity type as that of the light receiving portions 3 to 8. It is desirable in absorbing the stray light carriers generated due to the stray light emitted from the front surface of the semiconductor laser element 2 that both ends of the stray light carrier absorbing region 15 extend beyond the front surface position of the semiconductor laser element 2.

The stray light carrier absorbing region 15 absorbs the stray light carriers generated in the periphery of the concave portion 1a (that is, in the periphery of the light receiving portions 3 to 8) on the surface of the semiconductor substrate 1 due to the intrusion of the stray light generated from the semiconductor laser element 2 into the semiconductor substrate 1 in the direction of the light receiving portions 3 to 8. Moreover, the stray light carrier absorbing region 15 absorbs the stray light carriers generated by the stray light generated from the rear surface of the semiconductor laser element 2 being emitted rearward, obliquely rearward and sideward and intruding into the semiconductor substrate 1.

Moreover, the stray light carriers generated due to the intrusion of the stray light emitted from the front surface of the semiconductor laser element 2 so as to spread over a wide area into the semiconductor substrate 1 through, of the side surfaces of the concave portion 1a, the side surfaces between the semiconductor laser element 2 and the light receiving portions 3 to 8 can also be absorbed by the stray light carrier absorbing region 15.

In addition to absorbing the stray light carriers, the stray light carrier absorbing region 15 functions as a monitor region that detects the intensity of the signal detecting light from the semiconductor laser element 2 by detecting the light emitted from the rear surface of the semiconductor laser element 2. In other words, it can be said that the monitor region performs the stray light carrier absorbing function.

This embodiment is different from the second embodiment in that the stray light carrier absorbing region 15 is provided. Except this, the structure is the same as that of the second embodiment. In this case, by extending the depletion layer by applying a reverse bias to the stray light carrier absorbing region 15, holes are absorbed when the region is of p-type and electrons are absorbed when the region is of n-type.

The operation of the optical semiconductor device according to this embodiment structured as described above will be described.

First, stray light is generated simultaneously with the emission of the signal detecting light from the semiconductor laser element 2 on the semiconductor substrate 1. When the stray light is incident on side surfaces of the semiconductor substrate 1, stray light carriers are generated on the surface of the semiconductor substrate 1. However, by providing the stray light carrier absorbing region 15 in the areas between the semiconductor laser element 2 and the light receiving portions 3 to 8 and in the areas posterior to and obliquely posterior to the semiconductor laser element 2 on the semiconductor substrate 1, the stray light carrier absorbing region 15 absorbs the stray light carriers generated, particularly, in the periphery of the concave portion 1a on the surface of the semiconductor substrate 1, thereby preventing the stray light carriers from being absorbed by the light receiving portions 3 to 8.

As described above, according to the fourth embodiment, the stray light carriers generated in the periphery of the concave portion 1a (that is, in the periphery of the light receiving portions 3 to 8) on the surface of the semiconductor substrate 1 due to the stray light can be absorbed by the stray light carrier absorbing region 15. In this case, the stray light carriers generated due to the intrusion of the stray light emitted from the front surface of the semiconductor laser 2 so as to spread over a wide area into the semiconductor substrate 1 through, of the side surfaces of the concave portion 1a, the side surfaces between the semiconductor laser 2 and the light receiving portions 3 to 8 can be also absorbed by the stray light carrier absorbing region 15, that is, the monitor region. Consequently, the stray light carriers in the periphery of the concave portion 1a are prevented from being absorbed by the light receiving portions 3 to 8, so that signals of optical recording media can be more precisely output. Further, the intensity of the signal detecting light from the semiconductor laser element 2 can be detected. Except these, the effects are the same as those of the second embodiment.

While the stray light carrier absorbing region 15 and the monitor region are integrally formed in this embodiment, the stray light carrier absorbing region 15 and the monitor region may be separately formed. When the monitor region is separately formed, the part of the stray light carrier absorbing region 15 situated in the rear of the semiconductor laser element 2 may be omitted.

When the monitor region is centered on, the stray light carriers can be absorbed without the need to extend the monitor region to the areas at the sides of the semiconductor laser element 2. By extending the monitor region to the areas at the sides of the semiconductor laser element 2, the ability of absorbing the stray light carriers can be further improved.

While the stray light carrier absorbing region 15 is added to the structure of the second embodiment in the above-described fourth embodiment, it is to be noted that effects the same as the above-described effects obtained by the provision of the stray light carrier absorbing region 15 (or the monitor region) are obtained when the stray light carrier absorbing region 15 is added to the structure of the conventional example.

Fifth Embodiment

Figure 13:
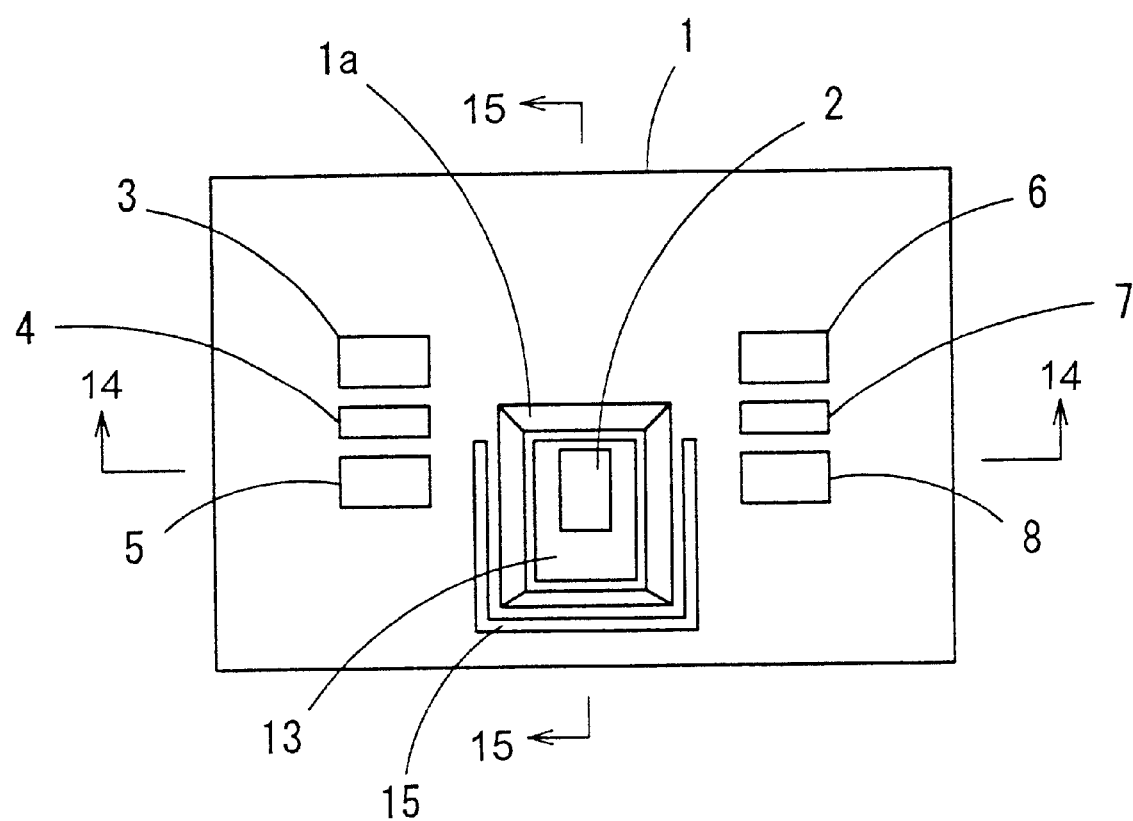
FIG. 13 is a plan view showing the structure of an optical semiconductor device according to a fifth embodiment of the present invention.
Figure 14:
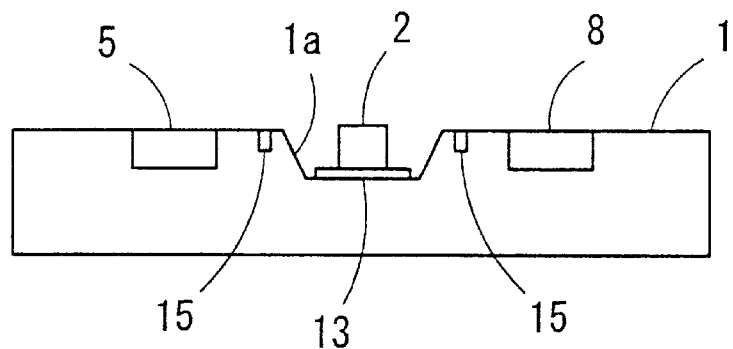
FIG. 14 is a cross-sectional view showing the structure of the optical semiconductor device.
Figure 15:
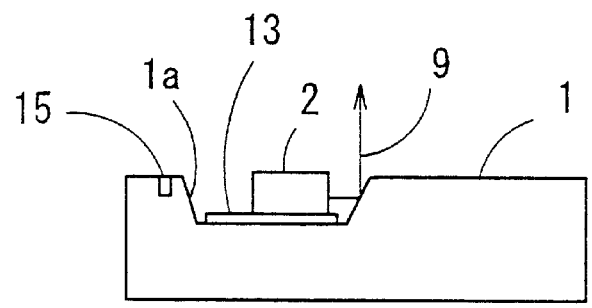
FIG. 15 is a cross-sectional view showing the structure of the optical semiconductor device.

A fifth embodiment of the present invention will be described with reference to the drawings. FIG. 13 is a plan view schematically showing a plane layout of an optical semiconductor device according to,the fifth embodiment of the present invention. FIG. 14 is a cross-sectional view schematically showing the cross section of FIG. 13 taken on the line 14—14 . FIG. 15 is a cross-sectional view schematically showing the cross section of FIG. 13 taken on the line 15—15.

In this optical semiconductor device, the stray light carrier absorbing region 15 the same as the one described with reference to FIGS. 10, 11 and 12 is added to the structure of the optical semiconductor device, shown in FIGS. 1, 2 and 3. The structure, operation and extensions thereof will not be described since they are the same as those described with reference to FIGS. 10, 11 and 12.

According to this embodiment, the effects described in the fourth embodiment are obtained in addition to the effects described in the first embodiment.

Sixth Embodiment

Figure 16:
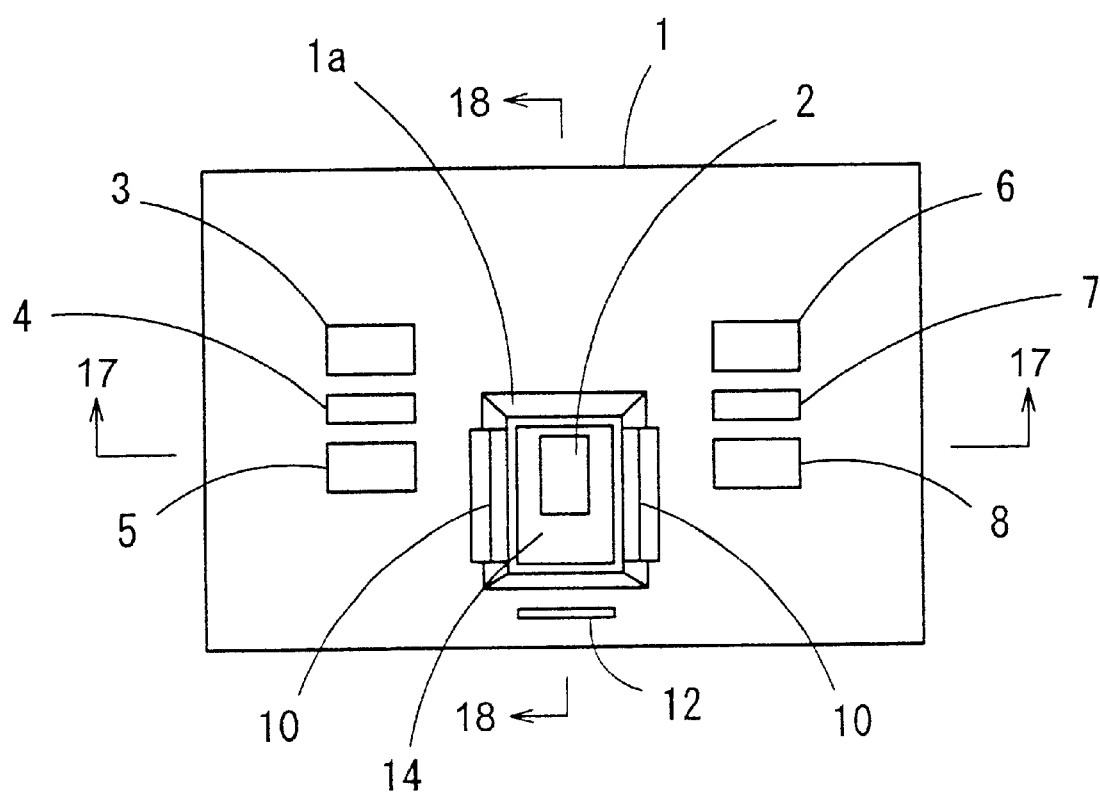
FIG. 16 is a plan view showing the structure of an optical semiconductor device according to a sixth embodiment of the present invention.
Figure 17:
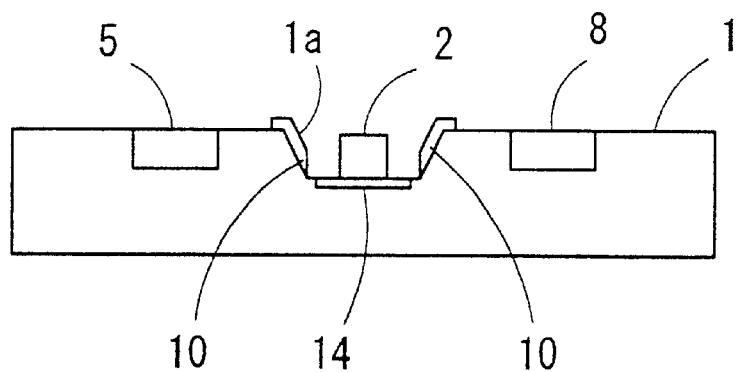
FIG. 17 is a cross-sectional view showing the structure of the optical semiconductor device.
Figure 18:
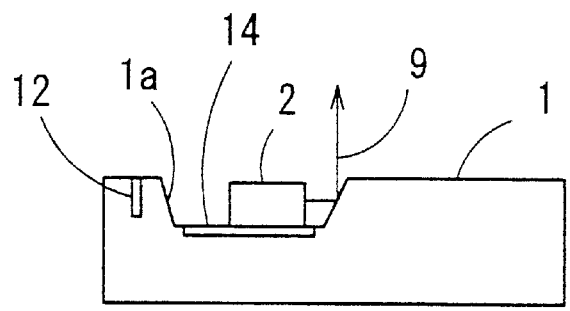
FIG. 18 is a cross-sectional view showing the structure of the optical semiconductor device.
Figure 19:
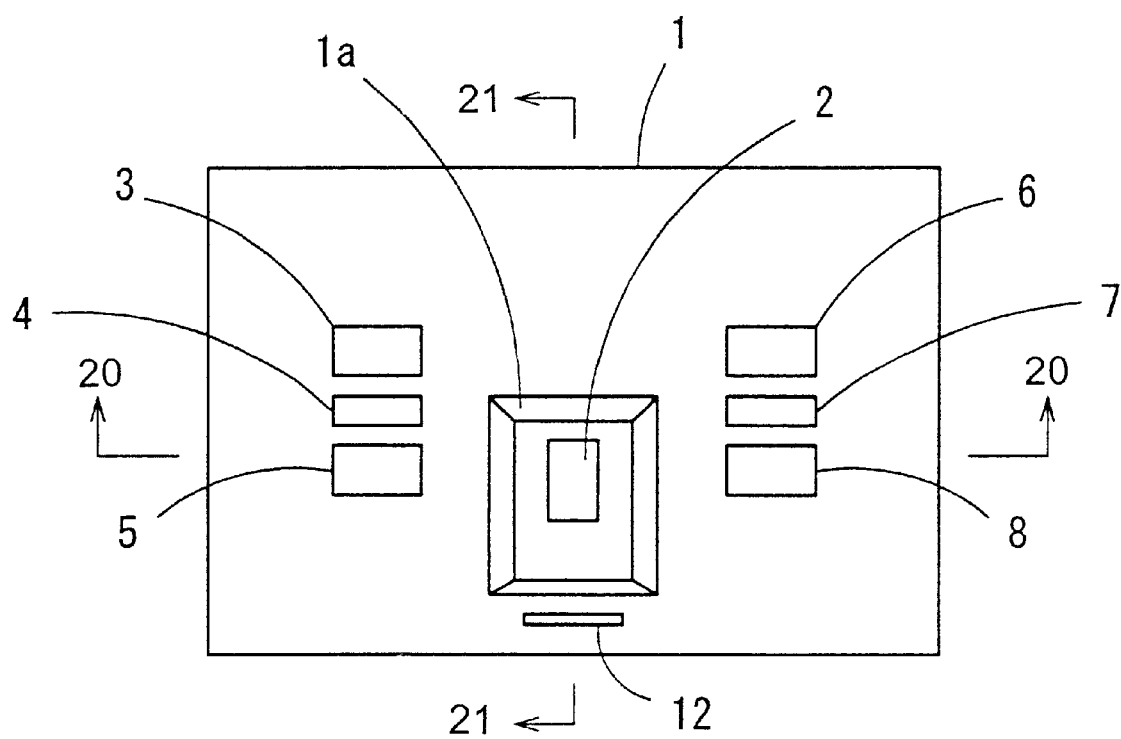
FIG. 19 is a plan view showing the structure of the conventional optical semiconductor device.
Figure 20:
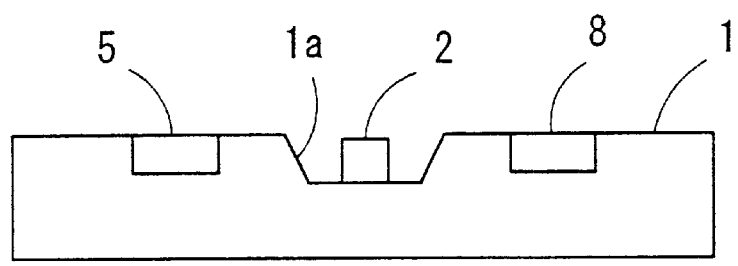
FIG. 20 is a cross-sectional view showing the structure of the optical semiconductor device.
Figure 21:
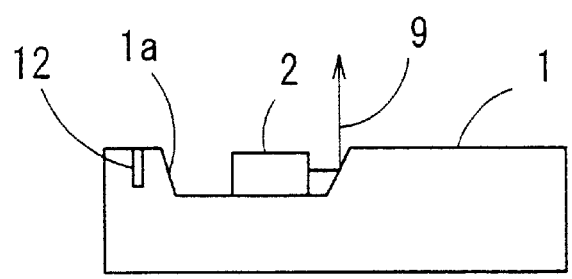
FIG. 21 is a cross-sectional view showing the structure of the optical semiconductor device.

A sixth embodiment of the present invention will be described with reference to the drawings. FIG. 16 is a plan view schematically showing a plane layout of an optical semiconductor device according to the sixth embodiment of the present invention. FIG. 17 is a cross-sectional view schematically showing the cross section of FIG. 16 taken on the line 17—17. FIG. 18 is a cross-sectional view schematically showing the cross section of FIG. 16 taken on the line 18—18.

In this optical semiconductor device, the light intercepting regions 10 the same as the ones described with reference to FIGS. 7, 8 and 9 are added to the structure of the optical semiconductor device shown in FIGS. 4, 5 and 6. The structure, operation and extensions thereof will not be described since they are the same as those described with reference to FIGS. 7, 8 and 9.

According to this embodiment, the effects described in the third embodiment are obtained in addition to the effects described in the second embodiment.

What is claimed is:

1. An optical semiconductor device comprising:
   a laser light source that emits light;
   a semiconductor substrate wherein said laser light source is mounted in a concave portion provided on a surface of said semiconductor substrate so that an optical axis of the light from said laser light source is substantially parallel to the surface of said semiconductor substrate, and the light from said laser light source is reflected at a side surface of the concave portion in a direction substantially perpendicular to the surface of said semiconductor substrate;

at least one light receiving portion provided in a peripheral area outside the concave portion on the surface of said semiconductor substrate;

a first light intercepting film provided at least in an area posterior to said laser light source on a bottom surface of the concave portion when a light emitting side of said laser light source is a front side; and a second light intercepting film provided at least on, of side surfaces of the concave portion, a side surface between said laser light source and said light receiving portion.

2. An optical semiconductor device according to claim 1, wherein said first light intercepting film is also formed in an area obliquely posterior to said laser light source on the bottom surface of the concave portion.

3. An optical semiconductor device according to claim 1, wherein said first light intercepting film is formed in an area surrounding said laser light source on all sides on the bottom surface of the concave portion.

4. An optical semiconductor device comprising:

a laser light source that emits light;

a semiconductor substrate wherein said laser light source is mounted in a concave portion provided on a surface of said semiconductor substrate so that an optical axis of the light from said laser light source is substantially parallel to the surface of said semiconductor substrate, and the light from said laser light source is reflected at a side surface of the concave portion in a direction substantially perpendicular to the surface of said semiconductor substrate;

at least one light receiving portion provided in a peripheral area outside the concave portion on the surface of said semiconductor substrate;

a stray light carrier absorbing region provided at least in an area posterior to said laser light source on a bottom surface of the concave portion when a light emitting side of said laser light source is a front side; and a light intercepting film provided at least on, of side surfaces of the concave portion, a side surface between said laser light source and said light receiving portion.

5. An optical semiconductor device according to claim 4, wherein said stray light carrier absorbing region is also formed in an area obliquely posterior to said laser light source on the bottom surface of the concave portion.

6. An optical semiconductor device according to claim 4, wherein said stray light carrier absorbing region is formed in an area surrounding said laser light source on all sides on the bottom surface of the concave portion.

* * * * *